(12) United States Patent
Hung et al.

(10) Patent No.: US 11,569,222 B2
(45) Date of Patent: Jan. 31, 2023

(54) LOW-VOLTAGE ELECTROSTATIC DISCHARGE (ESD) PROTECTION CIRCUIT, INTEGRATED CIRCUIT AND METHOD FOR ESD PROTECTION THEREOF

(71) Applicant: Changxin Memory Technologies, Inc., Anhui (CN)

(72) Inventors: Kei Kang Hung, Hefei (CN); Qi-An Xu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 364 days.

(21) Appl. No.: 16/888,545

(22) Filed: May 29, 2020

(65) Prior Publication Data
US 2020/0294992 A1    Sep. 17, 2020

Related U.S. Application Data

(63) Continuation of application No. PCT/CN2018/119918, filed on Dec. 7, 2018.

(30) Foreign Application Priority Data

Dec. 7, 2017 (CN) .......................... 201711282468.4

(51) Int. Cl.
   *H01L 27/02* (2006.01)
   *H02H 9/04* (2006.01)
(52) U.S. Cl.
   CPC ...... *H01L 27/0255* (2013.01); *H01L 27/0274* (2013.01); *H02H 9/046* (2013.01)
(58) Field of Classification Search
   CPC .. H01L 27/0255; H01L 27/0274; H02H 9/046
   See application file for complete search history.

(56) References Cited

U.S. PATENT DOCUMENTS

| | | | |
|---|---|---|---|
| 5,532,896 A * | 7/1996 | Coussens | H02H 9/046 |
| | | | 361/111 |
| 5,998,245 A * | 12/1999 | Yu | H01L 27/0255 |
| | | | 438/10 |

(Continued)

FOREIGN PATENT DOCUMENTS

| CN | 101336039 A | * | 12/2008 |
|---|---|---|---|
| CN | 101355357 A | * | 1/2009 |

(Continued)

OTHER PUBLICATIONS

Supplementary Search dated Aug. 7, 2020, issued in related Chinese Application No. 201711282468.4 (1 page).

(Continued)

*Primary Examiner* — Sisay G Tiku
(74) *Attorney, Agent, or Firm* — Sheppard Mullin Richter & Hampton LLP

(57) ABSTRACT

An electrostatic discharge protection circuit for an integrated circuit and a method for electrostatic discharge protection thereof are disclosed. The integrated circuit includes a power source, a ground, a signal input, and a signal output. The integrated circuit further comprises one or more essentially identically configured electrostatic discharge protection circuits, configured to provide electrostatic discharge protection between any two of the power source, the ground, the signal input, and the signal output. A method of providing electrostatic discharge protection includes providing one or more essentially identically configured electrostatic discharge protection circuits coupled between and providing electrostatic discharge protection for any two of the power source, the ground, the signal input, and the signal output. The disclosed integrated circuit and method provide advantages of simplifying the integrated circuit design and reducing design time.

18 Claims, 2 Drawing Sheets

(56) References Cited

U.S. PATENT DOCUMENTS

| | | | |
|---|---|---|---|
| 6,144,542 A | 11/2000 | Ker et al. | |
| 6,249,410 B1 * | 6/2001 | Ker | H02H 9/046 361/111 |
| 11,368,016 B2 * | 6/2022 | Walker | H01L 27/0292 |
| 2004/0141269 A1 * | 7/2004 | Kitagawa | H01L 27/0251 361/56 |
| 2005/0270712 A1 | 12/2005 | Huang et al. | |
| 2005/0286186 A1 * | 12/2005 | Chang | H01L 27/0292 361/56 |
| 2008/0217749 A1 * | 9/2008 | Matteson | H01L 27/0255 257/656 |
| 2022/0231009 A1 * | 7/2022 | Ikeda | H01L 27/0255 |

FOREIGN PATENT DOCUMENTS

| | | | | |
|---|---|---|---|---|
| CN | 101562187 A | | 10/2009 | |
| CN | 101562188 A | * | 10/2009 | |
| CN | 101626154 A | * | 1/2010 | |
| CN | 101562187 B | * | 9/2010 | |
| CN | 202394973 U | * | 8/2012 | |
| CN | 103296665 A | * | 9/2013 | |
| CN | 103928454 A | * | 7/2014 | |
| CN | 104051446 A | | 9/2014 | |
| CN | 203967081 U | * | 11/2014 | |
| CN | 104835816 A | * | 8/2015 | H01L 27/0285 |
| CN | 105388648 A | * | 3/2016 | |
| CN | 105388648 A | | 3/2016 | |
| CN | 206040646 U | * | 3/2017 | G02F 1/1335 |
| CN | 104051446 B | * | 6/2017 | |
| CN | 107910858 A | * | 4/2018 | H01L 27/0255 |
| CN | 107910858 A | | 4/2018 | |
| CN | 207782402 U | | 8/2018 | |
| CN | 210778581 U | * | 6/2020 | |
| DE | 102013204031 A1 | * | 9/2013 | H01L 27/0292 |
| WO | WO-2007016266 A2 | * | 2/2007 | H01L 27/0255 |

OTHER PUBLICATIONS

PCT International Preliminary Report on Patentability dated Jun. 18, 2020, issued in related International Application No. PCT/CN2018/119918 (6 pages).

PCT International Search Report and the Written Opinion dated Mar. 6, 2019, issued in related International Application No. PCT/CN2018/119918 (7 pages).

First Office Action dated May 7, 2019, issued in related Chinese Application No. 201711282468.4, with English machine translation (11 pages).

Second Office Action dated Jan. 2, 2020, issued in related Chinese Application No. 201711282468.4, with English machine translation (10 pages).

* cited by examiner

LOW-VOLTAGE ELECTROSTATIC DISCHARGE (ESD) PROTECTION CIRCUIT, INTEGRATED CIRCUIT AND METHOD FOR ESD PROTECTION THEREOF

CROSS-REFERENCE TO RELATED APPLICATIONS

This application is a continuation application of International Patent Application No. PCT/CN2018/119918, filed on Dec. 7, 2018, which claims priority to China Patent Application No. 201711282468.4, filed with the China Patent Office on Dec. 7, 2017 and entitled "LOW-VOLTAGE ELECTROSTATIC DISCHARGE (ESD) PROTECTION CIRCUIT, INTEGRATED CIRCUIT AND METHOD FOR ESD PROTECTION THEREOF" The above-referenced applications are incorporated herein by reference in their entirety.

TECHNICAL FIELD

The present invention relates to the field of integrated circuits (ICs) and, in particular to a low-voltage electrostatic discharge (ESD) protection circuit, an integrated circuit and a method of ESD protection thereof.

BACKGROUND

Protection against electrostatic discharge (ESD) is very important for integrated circuits (ICs), and a lot of researches have been carried out in this area of IC design. ESD may occur in the normal use, transportation and storage of electronics, and during the assembly and manufacturing of IC components. ESD occurs in unpredictable ways, and may lead to damages, defects and even total losses of the IC. In contemporary IC design and fabrication, special attention needs to be paid for the design of ESD protection circuits.

In current integrated circuits design, different ESD protection circuits are usually arranged respectively between a power supply and a signal input, between the signal input terminal and the ground, between the power supply and a signal output, and between the signal output and the ground to provide ESD protection. However, with integrated circuits becoming more and more powerful, more than one power supply domains often co-exist within a single integrated circuit. Accordingly, in order to achieve ESD protection, such an integrated circuit with multiple power supply domains will require more diversified ESD protection circuits. As a result, a lot of time needs to be consumed for the design of ESD protection circuits in integrated circuits. In view of this, it is desirable to design a novel low-voltage ESD protection circuit, integrated circuit and method of ESD protection thereof to resolve the above issues.

SUMMARY OF THE INVENTION

In view of the above-described issues in the prior art, it is an objective of the present invention to provide a low-voltage ESD protection circuit, an integrated circuit and a method of ESD protection thereof to address the time-consuming issue of designing different ESD protection circuits for different portions of the integrated circuit in modern chip design.

In order to achieve the above and other related objectives, an integrated circuit is provided that includes a power source, a ground, a signal input, and a signal output. The integrated circuit further includes one or more essentially identically configured electrostatic discharge protection circuits configured to provide electrostatic discharge protection for the integrated circuit. The one or more essentially identically configured electrostatic discharge protection circuits may be coupled between any two of the power source, the ground, the signal input, and the signal output to provide electrostatic discharge protection therebetween.

In some embodiments, an integrated circuit according to the present invention provides a low-voltage ESD protection circuit, comprising a first protection unit and a second protection unit, the first protection unit comprising a first diode and a second diode, the first diode having an anode coupled to a cathode of the second diode and serving as a first input terminal of the protection circuit, the first diode having a cathode coupled to an anode of the second diode and serving as a serial connection terminal of the first protection unit, the second protection unit comprising a third diode and a fourth diode, the third diode having an anode coupled to a cathode of the fourth diode and serving as a serial connection terminal of the second protection unit, the third diode having a cathode coupled to an anode of the fourth diode and serving as a second input terminal of the protection circuit, wherein the serial connection terminal of the first protection unit is coupled to the serial connection terminal of the second protection unit.

Preferably, each of the first, second, third and fourth diodes is selected from the group consisting of an avalanche diode and a transient voltage suppressor diode.

The present invention also provides an integrated circuit including a low-voltage electrostatic discharge (ESD) protection circuit, wherein the integrated circuit comprises a power supply terminal, a signal input terminal, a ground terminal, a signal output terminal and a low-voltage ESD protection circuit as defined above, wherein the low-voltage ESD protection circuit is disposed at least between any two of the power supply terminal, the signal input terminal, the ground terminal and the signal output terminal, and wherein the low-voltage ESD protection circuit is connected in series with at least a second low-voltage ESD protection circuit, and the number of serial connection for the low-voltage ESD protection is not smaller than a ratio of a voltage at the power supply terminal to a diode turn-on voltage.

Preferably, a low-voltage ESD protection circuit is disposed between the power supply terminal and the signal input terminal, the signal input terminal and the ground terminal, the power supply terminal and the signal output terminal, and the signal output terminal and the ground terminal.

Preferably, a low-voltage ESD protection circuit is disposed between the power supply terminal and the ground terminal.

Preferably, the integrated circuit further comprises an input buffer circuit coupled to the signal input terminal, the input buffer circuit comprising a first PMOS transistor and a first NMOS transistor, the first PMOS transistor having a source coupled to the power supply terminal, a gate coupled both to a gate of the first NMOS transistor and the signal input terminal and a drain coupled to a drain of the first NMOS transistor, the first NMOS transistor having a source coupled to the ground terminal.

Preferably, the integrated circuit further comprises an output buffer circuit coupled to the signal output terminal, the output buffer circuit comprising a second PMOS transistor and a second NMOS transistor, the second PMOS transistor having a source coupled to the power supply terminal, a gate coupled to a gate of the second NMOS transistor and a drain coupled both to a drain of the second NMOS transistor and the signal output terminal, the second NMOS transistor having a source coupled to the ground terminal.

Preferably, the integrated circuit comprises at least two different power supply domains, wherein a low-voltage ESD protection circuit is disposed between the power supply terminals of the different power supply domains, and wherein a low-voltage ESD protection circuit is disposed between the ground terminals of the different power supply domains.

The present invention also provides an ESD protection method for an integrated circuit. The method comprises disposing the low-voltage ESD protection circuit as described above between any two of a power supply terminal, a signal input terminal, a ground terminal and a signal output terminal and thereby providing a bidirectional ESD protection between the two of the power supply terminal, the signal input terminal, the ground terminal and the signal output terminal, wherein the low-voltage ESD protection circuit is connected in series with at least a second low-voltage ESD protection circuit, and the number of serial connection for the low-voltage ESD protection is not smaller than a ratio of a voltage at the power supply terminal to a diode turn-on voltage.

Preferably, a low-voltage ESD protection circuit is disposed between the power supply terminal and the signal input terminal, the signal input terminal and the ground terminal, the power supply terminal and the signal output terminal, and the signal output terminal and the ground terminal, thereby providing bidirectional ESD protections between the power supply terminal and the signal input terminal, the signal input terminal and the ground terminal, the power supply terminal and the signal output terminal, and the signal output terminal and the ground terminal.

Preferably, a low-voltage ESD protection circuit is disposed between the power supply terminal and the ground terminal, thereby providing a bidirectional ESD protection between the power supply terminal and the ground terminal.

Preferably, a low-voltage ESD protection circuit is disposed between power supply terminals of different power supply domains and wherein a low-voltage ESD protection circuit is disposed between ground terminals of the different power supply domains, thereby providing a bidirectional ESD protection between the different power supply domains.

It is important to note and understand that the electrostatic discharge protection circuits claimed and described above can be arranged and coupled between any two of the power source, the ground, the signal input, and the signal output as needed. What this means is that one ordinarily skilled in the art of integrated circuit design field may choose to arrange such a electrostatic discharge protection circuit, based on design needs (such as balancing the needs of the risk of any potential electrostatic discharge and other design constraints), in either one or any combinations of the following manners:

between the power source and the ground,
  between the power source and the signal input,
  between the power source and the signal output,
  between the ground and the signal input,
  between the ground and the signal output, and
  between the signal input and the signal output.

In addition, as described in more details below, such an electrostatic discharge protection circuit may be arranged between two different power source domains, either between each power source domain's power sources or between each power source domain's grounds.

As indicated below, this arrangement can make the designing of the electrostatic discharge protection portion of a complex integrated circuit less complicated, thereby saving design expenses and time substantially.

The low-voltage ESD protection circuit, the integrated circuit and the method of the present invention, as described above, offer the following benefits:

1. With the low-voltage ESD protection circuit of the present invention, ESD protections can be simultaneously enabled between the power supply terminal and the signal input terminal, the signal input terminal and the ground terminal, the power supply terminal and the signal output terminal, the signal output terminal and the ground terminal, and the power supply terminal and the ground terminal, thus resolving the time-consuming issue of designing various ESD protection circuits in integrated circuit design.

2. The low-voltage ESD protection circuit of the present invention provides flexibility in ESD design. A number of such low-voltage ESD protection circuits may be connected in series, according to the power supply voltage and the diode turn-on voltage, to provide suitable ESD protection for the power supply terminal. Thus, the low-voltage ESD protection circuits of the present invention are useful in simultaneously providing ESD protection to different power supply domains.

LIST OF REFERENCE NUMERALS OF ELEMENTS

Figure 1:
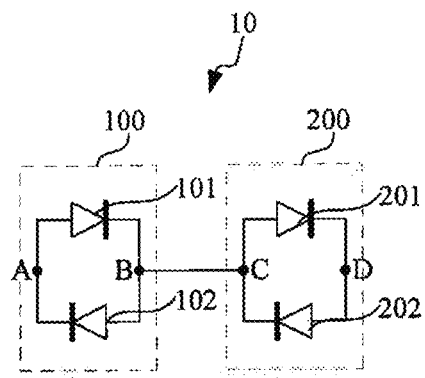
FIG. 1 shows a diagram of a low-voltage ESD protection circuit according to Embodiment 1 of the present invention.

10 low-voltage ESD protection circuit
11 first low-voltage ESD protection circuit
12 second low-voltage ESD protection circuit
100 first protection unit
101 first diode
102 second diode
200 second protection unit
201 third diode
202 fourth diode
20 signal input terminal
30 signal output terminal
40 input buffer circuit
50 output buffer circuit
60 internal circuit

DETAILED DESCRIPTION

Embodiments of the present invention will be described below by way of examples, and those skilled in the art can readily understand other advantages and functionalities of the invention from the disclosure herein. The present invention may also be carried out differently or used in other embodiments, and the details disclosed herein can be modified or changed depending on different circumstances and applications without departing from the spirit and scope of the invention.

Figure 2:
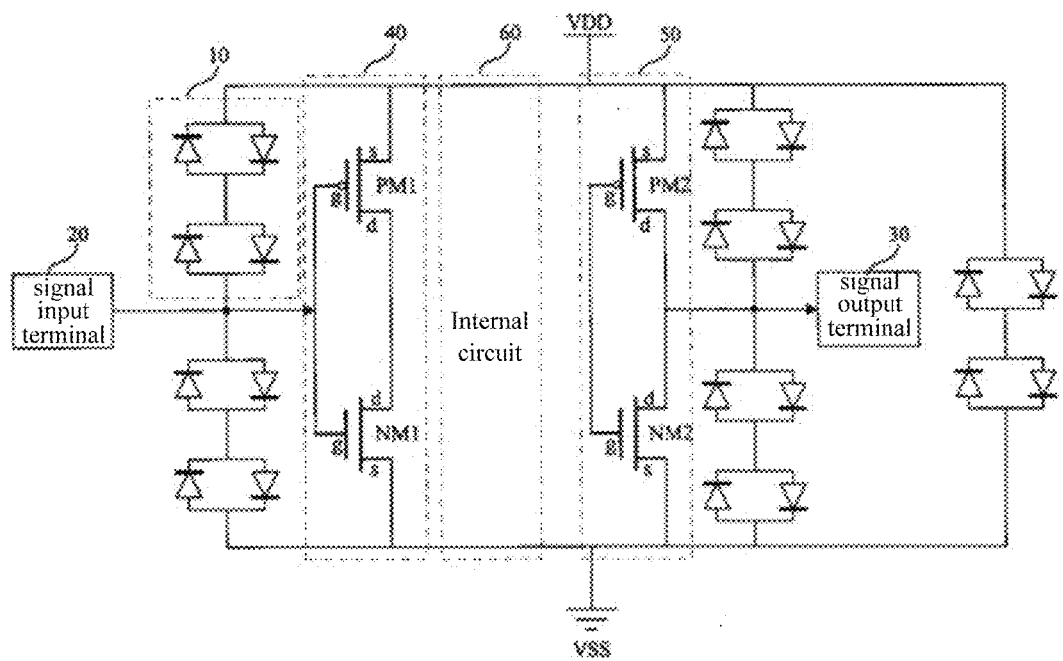
FIG. 2 shows a diagram of integrated circuit according to Embodiment 2 of the present invention.
Figure 3:
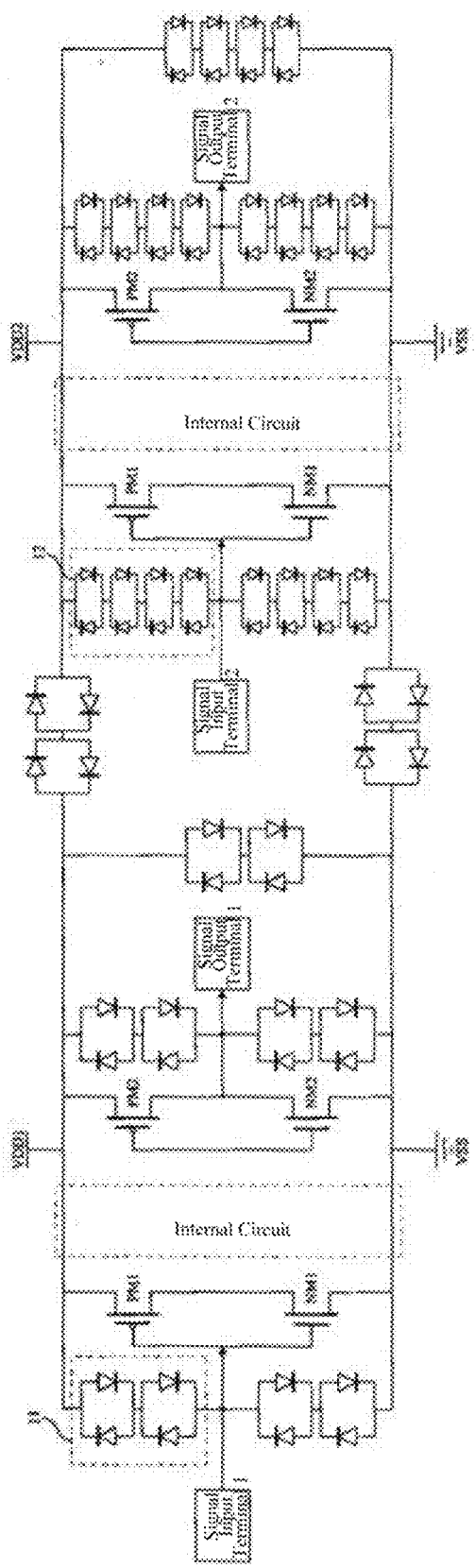
FIG. 3 shows a diagram of integrated circuit according to Embodiment 2 of the present invention.

The following description of the particular examples references FIGS. 1 to 3, which are provided merely for the purpose of illustrating certain embodiments of the present invention, and in which only the components related to the invention are shown, and not in scale. The number, shapes or proportions of the components in practice can differ, and the layout could be more complicated.

Embodiment 1

As shown in FIG. 1, in this embodiment, a low-voltage electrostatic discharge (ESD) protection circuit 10 including a first protection unit 100 and a second protection unit 200 is provided. The first protection unit 100 includes a first diode 101 and a second diode 102. The first diode 101 has an anode coupled to a cathode of the second diode 102 and serving as a first input terminal A of the protection circuit 10. The first diode 101 also has a cathode coupled to an anode of the second diode 102 and serving as a serial connection terminal B of the first protection unit 100. The second protection unit 200 includes a third diode 201 and a fourth diode 202. The third diode 201 has an anode coupled to a cathode of the fourth diode 202 and serving as a serial connection terminal C of the second protection unit 200. The third diode 201 also has a cathode coupled to an anode of the fourth diode 202 and serving as a second input terminal D of the protection circuit 10. The serial connection terminal B of the first protection unit 100 is coupled to the serial connection terminal C of the second protection unit 200.

As an example, each of the first diode 101, the second diode 102, the third diode 201 and the fourth diode 202 is selected from the group consisting of an avalanche diode and a transient voltage suppressor (TVS) diode.

As shown in FIG. 1, according to this embodiment, during use of the low-voltage ESD protection circuit 10, the first protection unit 100 is connected in series to the second protection unit 200 to form two conduction branches conducting in opposite directions. Thus, the first diode 101 and with the third diode 201 provide a first conduction branch conducting in a first direction, while the second diode 102 and the fourth diode 202 provide a second conduction branch conducting in a second direction. Therefore, the low-voltage ESD protection circuit according to this embodiment enables bidirectional ESD protection.

Embodiment 2

As shown in FIG. 2, in this embodiment, an integrated circuit including a low-voltage ESD protection circuit is provided. The integrated circuit includes a power supply terminal VDD, a signal input terminal 20, a ground terminal VSS, a signal output terminal 30 and the low-voltage ESD protection circuit 10 according to Embodiment 1. The low-voltage ESD protection circuit 10 is disposed at least between any two of the power supply terminal VDD, the signal input terminal 20, the ground terminal VSS and the signal output terminal 30. The low-voltage ESD protection circuit 10 is connected in series with at least a second low-voltage ESD protection circuit, and the number of serial connection for the low-voltage ESD protection is not smaller than a ratio of a voltage at the power supply terminal to a diode turn-on voltage.

It is to be noted that the signal input terminal 20 may be a signal input PAD, while the signal output terminal 30 may be a signal output PAD.

Specifically, the number of low-voltage ESD protection circuit(s) 10 disposed between any terminal pair may vary with the voltage at the power supply terminal of the integrated circuit. For example, if the voltage at the power supply terminal is 1.2 V and the diode turn-on voltage is 0.7 V, the number of low-voltage ESD protection circuit(s) 10 between any terminal pair is at least one. If the voltage at the power supply terminal is 2.5 V and the diode turn-on voltage is 0.7 V, the number of low-voltage ESD protection circuits 10 between any terminal pair is at least two, and these low-voltage ESD protection circuits are connected in series.

As an example, as shown in FIG. 2, in order for bidirectional ESD protections between the power supply terminal VDD and the signal input terminal 20, the signal input terminal 20 and the ground terminal VSS, the power supply terminal VDD and the signal output terminal 30, and the signal output terminal 30 and the ground terminal VSS to be achieved, one low-voltage ESD protection circuit 10 is disposed between each pair of the power supply terminal VDD and the signal input terminal 20, the signal input terminal 20 and the ground terminal VSS, power supply terminal VDD and the signal output terminal 30, and the signal output terminal 30 and the ground terminal VSS.

As an example, as shown in FIG. 2, one low-voltage ESD protection circuit may be disposed between the power supply terminal VDD and the power supply terminal VSS so as to provide a bidirectional ESD protection therebetween.

As an example, as shown in FIG. 2, the integrated circuit may further include an input buffer circuit 40 coupled to the signal input terminal, the input buffer circuit 40 including a first PMOS transistor PM1 and a first NMOS transistor NM1, the first PMOS transistor PM1 having a source s coupled to the power supply terminal VDD, a gate g coupled both to a gate g of the first NMOS transistor NM1 and the signal input terminal 20 and a drain d coupled to a drain d of the first NMOS transistor NM1, the first NMOS transistor NM1 having a source s coupled to the ground terminal VSS.

As an example, as shown in FIG. 2, the integrated circuit may further include an output buffer circuit 50 coupled to the signal output terminal, the output buffer circuit 50 including a second PMOS transistor PM2 and a second NMOS transistor NM2, the second PMOS transistor PM2 having a source s coupled to the power supply terminal VDD, a gate g coupled to a gate g of the second NMOS transistor NM2 and a drain d coupled both to a drain d of the second NMOS transistor NM2 and the signal output terminal 30, the second NMOS transistor NM2 having a source s coupled to the ground terminal VSS.

As an example, as shown in FIG. 2, the integrated circuit may further include an internal circuit 60 disposed between the input buffer circuit 40 and the output buffer circuit 50 and configured to perform main functions of the integrated circuit.

As an example, if the integrated circuit has at least two different power supply domains, a low-voltage ESD protection circuit 10 may be disposed between power supply terminals of the different power supply domains, and a low-voltage ESD protection circuit 10 may be disposed between ground terminals of the different power supply domains, so as to provide a bidirectional ESD protection between different power supply domains.

Specifically, as shown in FIG. 3, the integrated circuit may include two different power supply domains: a first power supply domain with a power supply terminal at which a voltage VDD1 of 1.2 V is applied; and a second power supply domain with a power supply terminal at which a voltage VDD2 of 2.5 V is applied. In this case, one low-voltage ESD protection circuit 10 may be included in each first low-voltage ESD protection circuit 11 of the first power supply domain, while two low-voltage ESD protection circuits 10 connected in series may be included in each second low-voltage ESD protection circuit 12 of the second power supply domain. In addition, one low-voltage ESD protection circuit 10 may be disposed between the power supply terminals of the first power supply domain and the second power supply domain, and one low-voltage ESD protection circuit 10 may be disposed between ground terminals of the first power supply domain and the second power supply domain.

Embodiment 3

In this embodiment, a method for ESD protection for an integrated circuit is provided. The method includes: disposing the low-voltage ESD protection circuit according to Embodiment 1 between any two of the power supply terminal VDD, the signal input terminal 20, the ground terminal VSS and the signal output terminal 30 and thereby providing a bidirectional ESD protection between the two of the power supply terminal VDD, the signal input terminal 20, the ground terminal VSS and the signal output terminal 30, wherein the low-voltage ESD protection circuit 10 is connected in series with at least a second low-voltage ESD protection circuit, and the number of serial connection for the low-voltage ESD protection is not smaller than a ratio of a voltage at the power supply terminal to a diode turn-on voltage.

As an example, low-voltage ESD protection circuits 10, 11, 12 may be disposed between the power supply terminal VDD and the signal input terminal 20, the signal input terminal 20 and the ground terminal VSS, the power supply terminal VDD and the signal output terminal 30, and the signal output terminal 30 and the ground terminal VSS, thereby providing bidirectional ESD protections between the power supply terminal VDD and the signal input terminal 20, the signal input terminal 20 and the ground terminal VSS, the power supply terminal VDD and the signal output terminal 30, and the signal output terminal 30 and the ground terminal VSS.

As an example, a low-voltage ESD protection circuit may be disposed between the power supply terminal VDD and the ground terminal VSS, thereby providing a bidirectional ESD protection between the power supply terminal VDD and the ground terminal VSS.

As an example, a low-voltage ESD protection circuit may be disposed between power supply terminals of different power supply domains, and ground terminals of different power supply domains in the integrated circuit, thereby providing a bidirectional ESD protection between the different power supply domains.

Therefore, the protection circuits can provide a bidirectional ESD protection either to a single power supply domain between its power supply terminal and signal input terminal, its signal input terminal and ground terminal, its power supply terminal and signal output terminal, and its signal output terminal and ground terminal or to multiple power supply domains between their power supply terminals, and their ground terminals, simply by connecting a suitable number of ESD protection circuits in series therebetween.

In summary, the low-voltage ESD protection circuit, the integrated circuit and the method of the present invention, as defined above, offer the following benefits:

1. With the low-voltage ESD protection circuit of the present invention, an ESD protection can be simultaneously enabled between the power supply terminal and the signal input terminal, the signal input terminal and the ground terminal, the power supply terminal and the signal output terminal, the signal output terminal and the ground terminal, and the power supply terminal and the ground terminal, thus resolving the time-consuming issue of designing various ESD protection circuits in integrated circuit design.

2. The low-voltage ESD protection circuit of the present invention provides flexibility in ESD design. A number of such low-voltage ESD protection circuits may be connected in series, according to the power supply voltage and the diode turn-on voltage, to provide suitable ESD protection for the power supply terminal. Thus, the low-voltage ESD protection circuits of the present invention are useful in simultaneously providing ESD protection to different power supply domains.

Therefore, the present invention resolves the various issues of the prior art, and has significant value in industrial use.

The embodiments presented above are merely illustrative of the principles and effects of the present invention rather than limiting it any way. Any person familiar with the art can make modifications or changes to these embodiments, without departing from the spirit and scope of the invention. Accordingly, any and all equivalent modifications or changes made by those of ordinary skill in the art without departing from the spirit of the invention are within the scope of the invention as defined by the appended claims.

What is claimed is:

1. An integrated circuit comprising a power source, a ground, a signal input, and a signal output, wherein the integrated circuit further comprises a plurality of essentially identically configured electrostatic discharge protection circuits configured to provide electrostatic discharge protection between any two of the power source, the ground, the signal input, and the signal output, wherein each of the plurality of electrostatic discharge protection circuits comprises at least two diodes connected in series; wherein one or more of the plurality of electrostatic discharge protection circuits are disposed between the power source and the signal input, between the signal input and the ground, between the power source and the signal output, and between the signal output and the ground; and wherein a number of the one or more of the plurality of electrostatic discharge protection circuits is greater than a ratio of a voltage difference between the power source and the ground to a diode turn-on voltage of one of the two diodes.

2. The integrated circuit of claim 1, wherein the one or more of the plurality of electrostatic discharge protection circuits are in serial connection between any two of the power source, the ground, the signal input, and the signal output.

3. The integrated circuit of claim 1, comprising at least two power source domains providing power supply to the integrated circuit, wherein the one or more of the plurality of electrostatic discharge protection circuits are disposed between power sources of the two power source domains and disposed between grounds of the two power source domains, respectively.

4. The integrated circuit of claim 1, wherein each of the plurality of electrostatic discharge protection circuits comprises:
a first protection unit comprising a first diode and a second diode and a second protection unit comprising a third diode and a fourth diode,
wherein the first diode comprises an anode coupled to a cathode of the second diode and configured as a first input terminal of the electrostatic discharge protection circuit, wherein the first diode comprises a cathode coupled to an anode of the second diode and configured as a serial connection terminal of the first protection unit, wherein the third diode comprises an anode coupled to a cathode of the fourth diode and configured as a serial connection terminal of the second protection unit, wherein the third diode comprises a cathode coupled to an anode of the fourth diode and configured as a second input terminal of the electrostatic discharge protection circuit, and wherein the serial connection terminal of the first protection unit is coupled to the serial connection terminal of the second protection unit.

5. The integrated circuit of claim 4, wherein the first diode, the second diode, the third diode and the fourth diode are an avalanche diode or a transient voltage suppression device.

6. The integrated circuit of claim 4, further comprising an input buffer circuit coupled to the signal input.

7. The integrated circuit of claim 6, wherein the input buffer circuit comprises a first PMOS transistor and a first NMOS transistor, the first PMOS transistor having a source coupled to the power source, a gate electrode coupled both to a gate of the first NMOS transistor and the signal input and a drain coupled to a drain of the first NMOS transistor, the first NMOS transistor having a source coupled to the ground.

8. The integrated circuit of claim 4, further comprising an output buffer circuit coupled to the signal output.

9. The integrated circuit of claim 8, wherein the output buffer circuit comprises a second PMOS transistor and a second NMOS transistor, the second PMOS transistor having a source coupled to the power source, a gate coupled to a gate of the second NMOS transistor and a drain coupled both to a drain of the second NMOS transistor and the signal output, the second NMOS transistor having a source coupled to the ground terminal.

10. A method of providing electrostatic discharge protection for an integrated circuit comprising a power source, a ground, a signal input, and a signal output, the method comprising: providing a plurality of essentially identically configured electrostatic discharge protection circuits, wherein one or more of the plurality of electrostatic discharge protection circuits are coupled between and providing electrostatic discharge protection for the following pairs of circuit signals: the power source and the ground, the power source and the signal input, the power source and the signal output, the ground and the signal input, the ground and the signal output, and the signal input and the signal output, wherein each of the plurality of electrostatic discharge protection circuits comprises at least two diodes connected in series; and wherein a number of the one or more of the plurality of electrostatic discharge protection circuits is greater than a ratio of a voltage difference between the power source and the ground to a diode turn-on voltage of one of the two diodes.

11. The method of claim 10, wherein the one or more of the plurality of electrostatic discharge protection circuits are in serial connection between any two of the power source, the ground, the signal input, and the signal output.

12. The method of claim 10, wherein the integrated circuit comprises at least two power source domains providing power supply to the integrated circuit, wherein the one or more of the plurality of electrostatic discharge protection circuits are disposed between power sources of the two power source domains and disposed between grounds of the two power source domains, respectively.

13. The method of claim 10, wherein each of the plurality of electrostatic discharge protection circuits comprises:

a first protection unit comprising a first diode and a second diode and a second protection unit comprising a third diode and a fourth diode, wherein the first diode comprises an anode coupled to a cathode of the second diode and configured as a first input terminal of the electrostatic discharge protection circuit, wherein the first diode comprises a cathode coupled to an anode of the second diode and configured as a serial connection terminal of the first protection unit, wherein the third diode comprises an anode coupled to a cathode of the fourth diode and configured as a serial connection terminal of the second protection unit, wherein the third diode comprises a cathode coupled to an anode of the fourth diode and configured as a second input terminal of the electrostatic discharge protection circuit, and wherein the serial connection terminal of the first protection unit is coupled to the serial connection terminal of the second protection unit.

14. The method of claim 13, further comprising an input buffer circuit coupled to the signal input.

15. The method of claim 14, wherein the input buffer circuit comprises a first PMOS transistor and a first NMOS transistor, the first PMOS transistor having a source coupled to the power source, a gate electrode coupled both to a gate of the first NMOS transistor and the signal input and a drain coupled to a drain of the first NMOS transistor, the first NMOS transistor having a source coupled to the ground.

16. The method of claim 13, further comprising an output buffer circuit coupled to the signal output.

17. The method of claim 16, wherein the output buffer circuit comprises a second PMOS transistor and a second NMOS transistor, the second PMOS transistor having a source coupled to the power source, a gate coupled to a gate of the second NMOS transistor and a drain coupled both to a drain of the second NMOS transistor and the signal output, the second NMOS transistor having a source coupled to the ground terminal.

18. The method of claim 13, wherein the first diode, the second diode, the third diode and the fourth diode are an avalanche diode or a transient voltage suppression device.

* * * * *